United States Patent [19]
Jackson et al.

[11] Patent Number: 5,469,029
[45] Date of Patent: Nov. 21, 1995

[54] DEFLECTION APPARATUS FOR RASTER SCANNED CRT DISPLAYS

[75] Inventors: Frederick S. Jackson, Newton Mearns, Scotland; David Leaver, Hassocks, United Kingdom

[73] Assignee: International Business Machines Corporation, Armonk, N.Y.

[21] Appl. No.: 248,983

[22] Filed: May 25, 1994

[30] Foreign Application Priority Data

May 26, 1993 [GB] United Kingdom .................. 9310853
Jun. 15, 1993 [GB] United Kingdom .................. 9312270

[51] Int. Cl.$^6$ .................. H01J 29/70; H01J 29/76
[52] U.S. Cl. .................. 315/408; 315/411
[58] Field of Search .................. 315/411, 387, 315/399, 408

[56] References Cited

U.S. PATENT DOCUMENTS

5,017,844  5/1991  Lendaro .................. 315/408
5,276,604  1/1994  Messman .................. 315/411

*Primary Examiner*—Theodore M. Blum
*Attorney, Agent, or Firm*—David Aker

[57] ABSTRACT

Deflection apparatus for a raster scanned cathode ray tube display comprises a flyback circuit (T2,T4,Ly,Df,Cf) including a switch (T2,T4) connected in series with an inductor (Ly). The switch (T4) is responsive to a line drive signal (LINE) to alternately open and close a current path through the inductor (Ly) between a first voltage level (B+) and a second voltage level (0V) lower than the first voltage level (B+) to generate a raster scan current signal in a deflection coil of the display. The amplitude of the raster scan signal is determined as a function of the first voltage level (B+) and the frequency of the line drive signal (LINE). A feedback circuit (D2,R3,D3,C2) connected to the switch (T4) generates a feedback signal (F) as a function of current flowing out of the switch (T4). A regulator (600-630,T3,L,D1,C1) is connected to the flyback circuit (T2,T4,Ly,Df,Cf) for varying the first voltage level (B+) as a function of the feedback signal (F) to maintain a constant raster scan width despite variations in the frequency of the line drive signal (LINE).

20 Claims, 6 Drawing Sheets

DEFLECTION APPARATUS FOR RASTER SCANNED CRT DISPLAYS

The present invention relates to deflection apparatus for a raster scanned CRT display.

Many raster scanned CRT displays are now designated to be compatible with a wide range of computer systems each capable of generating one or more different raster display formats. Each raster display format is generally characterised by a different pair of line and frame scanning frequencies.

A conventional line scan circuit for driving the horizontal deflection coils for a CRT display comprises a ramp generator for producing a line scan current signal in the deflection coils in synchronisation with a raster line synchronisation (sync) signal generated by the host computer. The line scan signal is generally in the form of a sawtooth waveform. However, to bring the angular velocity into line with the arc of the CRT to ensure that the the or each electron beam tracks each line of the raster with constant velocity, a degree of "S correction" is applied to the line scan signal. The degree of "S correction" is determined by an S correction capacitance conventionally connected in series with the deflection coils.

The amplitude of the line scan signal is inversely proportional to the frequency of the line sync signal. Therefore, the width of the picture displayed on the CRT screen is inversely proportional to the frequency of the line sync signal.

Typically, in CRT displays that are capable of displaying different raster display formats, a ramp regulator is connected to the ramp generator to reduce the effect of changes in line sync frequency on displayed picture width by varying teh amplitude of the line scan signal as a function of a reference input and and a feedback signal. The feedback signal is generated as a function of the line scan signal by a feedback circuit connected to the ramp generator and the regulator. The feedback circuit typically includes a sense component inserted into the path of the line scan signal to generate the feedback signal as a function of the line scan signal. However, the presence of the sense component in the path of the line scan signal degrades the line scan signal by introducing energy losses and potential ringing to the ramp generator.

In some conventional CRT displays, the ramp regulator is configured to operate only within discrete bands of line sync frequencies each centred on a different commonly-used line sync frequency. Each band is separated from adjacent bands by a dead band. The dead bands prevent the ramp regulator from spuriously toggling between adjacent bands.

A disadvantage associated with displays having banded width regulation is that they cannot operate at line sync frequencies within the dead bands. Furthermore, complex switching circuitry is required to implement banded width regulation. Thus, displays having banded width regulation therefore contain a large number of components and are consequently expensive to manufacture.

In accordance with the present invention, there is now provided deflection apparatus for a raster scanned cathode ray tube display, the apparatus comprising: a flyback circuit including a switch comprising a bipolar transistor connected in series with a first inductor, the switch being responsive to a line drive signal to alternately open and close a current path through the first inductor between a first voltage level and a second voltage level lower than the first voltage level to generate a raster scan current signal in a deflection coil of the display, the amplitude of the raster scan signal being determined as a function of the first voltage level and the frequency of the line drive signal; a feedback circuit connected to the base electrode of the bipolar transistor for generating a feedback signal as a function of current flowing out of the transistor via the base electrode of the bipolar transistor; and a regulator connected to the flyback circuit for varying the first voltage level as a function of the feedback signal to maintain a constant raster scan width despite variations in the frequency of the line drive signal. Because the feedback signal is derived from the current flowing out of the base of the transistor in the switch, the feedback signal can be produced without introducing energy losses or potential ringing into the current path through the deflection coils and thus without adversely affecting the linearity of the line scan signal.

Preferably, the feedback circuit comprises a sense resistor in a current path between the base electrode of the bipolar transistor and the second voltage level, the feedback signal being determined by a voltage signal produced across the sense resistor as a function of current flowing from the base electrode of the transistor and through the sense resistor towards the second voltage level. A peak detector is preferably connected to the sense resistor, the feedback signal being determined by a voltage level generated by the peak detector in response to the voltage signal produced across the sense resistor. The feedback circuit of the present invention can thus be implemented by relatively simple and cheap electrical components and circuitry.

The switch preferably comprises a field effect transistor connected in series with the bipolar transistor in an emitter switching configuration, the gate electrode of the field effect transistor being connected to receive the line drive signal to alternately open and close the current path through the first inductor between the first voltage level and the second voltage level. In a preferred example of the present invention, the bipolar transistor is an NPN transistor, the collector electrode of the bipolar transistor being connected to the first inductor, the emitter electrode of the bipolar transistor being connected to the field effect transistor, current flowing from the first inductor into the collector electrode of the bipolar transistor and out of the base electrode of the bipolar transistor in response to the field effect transistor turning off.

The regulator preferably comprises a boost circuit connected to the flyback circuit, the boost circuit comprising a second inductor connected in series with a second switch, the second switch being responsive to a pulse signal derived from the line drive signal to alternately open and close a current path through the second inductor between the second voltage level and a third voltage level higher than the second voltage level to generate the first voltage level, the first voltage level being determined as a function of the third voltage level and the width of the pulses of the pulse signal, the regulator being connected to the boost circuit for varying the width of the pulses of the pulse signal as a function of the amplitude of the line scan signal. The boost circuit provides a cheap solution to the problem of enabling the deflection apparatus to operate over a wide range of frequencies without dead bands.

In a particularly preferred embodiment of the present invention, the first inductor includes the raster deflection coil. This simplifies the deflection apparatus and therefore reduces manufacturing costs.

The boost circuit preferably comprises an S correction capacitor for providing S correction to the scan current signal. This alleviates the requirement for a conventional S correction capacitor at the output of the ramp generator and thus provides a further circuit simplification.

In a preferred arrangement of the present invention, the regulator comprises an error amplifier connected to the feedback circuit for generating an error signal as a function of the difference between the feedback signal and a reference level, and a pulse width modulator connected to the error amplifier and the boost circuit for modulating the width of the pulse signal as a function of the error signal. The pulse width modulator preferably comprises: a current sensor connected to the boost circuit for generating a ramp signal as a function of current flowing in the second current path; a comparator connected to the error amplifier for generating an output signal when the ramp signal exceeds the error signal; and a latch connected to the boost circuit and the comparator for generating the pulse signal at the control electrode of the second transistor switch, the latch being set in response to the rising edge of the line drive signal, and the latch being reset in response to the output signal from the comparator. This advantageously improves the transient response of the regulator.

The regulator is preferably adapted to vary the width of the pulses of the pulse signal as a function of an East-West pin cushion distortion correction signal. The regulator can also be adapted to provide for width adjustment and presetting.

Viewing the present invention from another aspect, there is now provided deflection apparatus for a raster scanned cathode ray tube display, the apparatus comprising: a ramp generator having a flyback circuit including a first inductor connected in series with a first transistor switch, the first transistor switch being responsive to a line drive signal to alternately open and close a current path through the first inductor between a first voltage level and a second voltage level lower than the first voltage level to generate a raster scan current signal in a deflection coil of the display, the amplitude of the raster scan current signal being determined as a function of the first voltage level and the frequency of the line drive switching signal, and a boost circuit connected to the flyback circuit, the boost circuit comprising a second inductor connected in series with a second transistor switch, the second transistor switch being responsive to a pulse signal synchronised to the line drive signal to alternately open and close a current path through the second inductor between the second voltage level and a third voltage level higher than the second voltage level to generate the first voltage level, the first voltage level being determined as a function of the third voltage level and the width of the pulses of the pulse signal; and a regulator connected to the flyback circuit and the boost circuit for varying the width of the pulses of the pulse signal as a function of the amplitude of the line scan signal to maintain a constant raster line width as the frequency of the line drive signal is varied. The present invention thus advantageously provides a simple and therefore inexpensive deflection circuit which is capable of operating over a wide range of frequencies without dead bands.

In preferred embodiments of the present invention, the regulator comprises: a feedback circuit connected to the flyback circuit for generating a feedback signal as a function of the amplitude of the voltage impulse signal; an error amplifier connected to the feedback circuit for generating an error signal as a function of the difference between the feedback signal and a reference level, and a pulse width modulator connected to the error amplifier and the boost circuit for modulating the width of the pulse signal as a function of the error signal.

The pulse width modulator preferably comprises: a current sensor connected to the boost circuit for generating a ramp signal as a function of current flowing in the second current path; a comparator connected to the error amplifier for generating an output signal when the ramp signal exceeds the error signal; and a latch connected to the boost circuit and the comparator for generating the pulse signal at the control electrode of the second transistor switch, the latch being set in response to the rising edge of the line drive signal, and the latch being reset in response to the output signal from the comparator.

Preferably, the first and second transistor switches each comprise a field effect transistor.

Viewing a third aspect of the present invention, there is now provided apparatus for generating an anode voltage for a CRT display, the generator comprising: a flyback circuit including a transformer having a primary winding connected in series with a first transistor switch, the first transistor switch being responsive to a line drive signal to alternately open and close a current path through the primary winding between a first voltage level and a second voltage level lower than the first voltage level to generate a voltage impulse signal across the primary winding, the amplitude of the voltage impulse signal being determined as a function of the first voltage level and the frequency of the line drive switching signal, and a boost circuit connected to the flyback circuit, the boost circuit comprising an inductor connected in series with a second transistor switch, the second transistor switch being responsive to a pulse signal synchronised to the line drive signal to alternately open and close a current path through the inductor between the second voltage level and a third voltage level higher than the second voltage level to generate the first voltage level, the first voltage level being determined as a function of the third voltage level and the width of the pulses of the pulse signal; and a regulator connected to the flyback circuit and the boost circuit for varying the width of the pulses of the pulse signal as a function of the amplitude of the voltage impulse signal to maintain a constant anode voltage as the frequency of the line drive signal is varied. The present invention thus extends to providing a simple and therefore inexpensive EHT generator which is capable of operating over a wide range of frequencies without dead bands.

It will be appreciated that the present invention extends to a CRT display comprising the above described apparatus. Such apparatus advantageously permits such a CRT display to be driven by a variety of computer system units each having a different display format. Furthermore, it will be appreciated that the present invention extends to a CRT display comprising the above apparatus. It will also be appreciated that the present invention extends to a computer system comprising such a CRT display, together with a processor connected to the CRT display for generating raster synchronisation signals and for varying the frequency of at least one of the raster synchronisation signals to produce different display modes.

Preferred embodiments of the present invention will now be described, by way of example only, with reference to the accompanying drawings in which.

Figure 1:
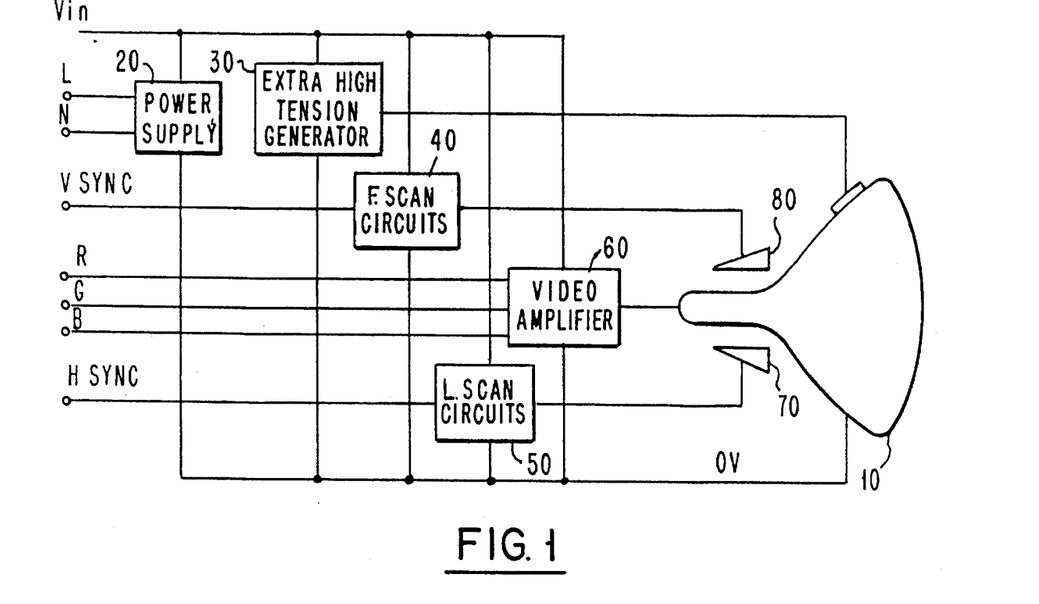
FIG. 1 is a block diagram of a CRT display.

Referring first to FIG. 1, a CRT display comprises a Cathode Ray Tube (CRT) 10 connected to an Extra High Tension voltage (EHT) generator 30 and a video amplifier 60. Frame and line deflection coils, 80 and 70 respectively, are disposed around the neck of the CRT 10. Deflection coils 80 and 70 are connected to frame and line scan circuits, 40 and 50, respectively. A power supply 20 is connected via power supply rails Vin and 0 V to the EHT generator 30, video amplifier 60 and scan circuits 40 and 50.

In operation, EHT generator 30 generates an electric field within CRT 10 for accelerating electrons in beams towards the screen of CRT 10. Frame and line scan circuits 40 and 50 generate frame and line scan currents in deflection coils 80 and 70. The line and frame scan currents are in the form of ramp signals to produce time-varying magnetic fields that scan the electron beams across CRT screen 10 in a raster pattern. The line and frame scan signals are synchronised by line and frame scan circuits 50 and 40 to input line and frame sync signals, HSYNC and VSYNC, generated by a host computer system (not shown). Video amplifier 60 modulates the electron beams to produce an output display on CRT 10 as a function of input video signals, R,G and B, also generated by the host computer system.

Figure 2:
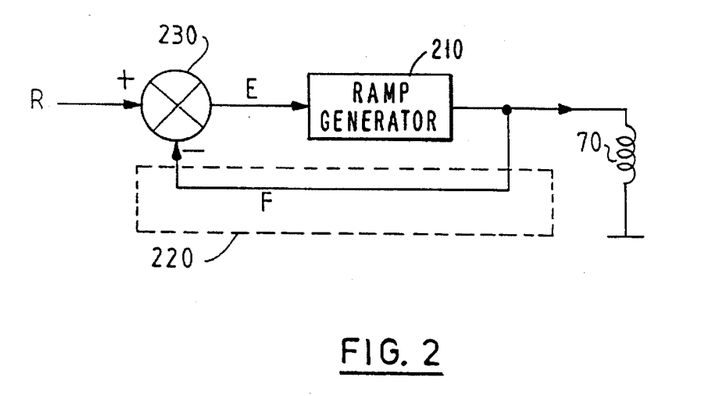
FIG. 2 is a block diagram of a line scan circuit of the CRT display.

Referring now to FIG. 2, line scan circuit 50 comprises a ramp generator 210 connected to horizontal deflection coils 70. A ramp regulator 230 is connected to the ramp generator to allow the CRT display to display different picture formats. The output of the ramp generator is connected to the input of the ramp regulator 230 via a feedback circuit 220.

In operation, ramp generator 210 produces a line scan current signal in deflection coils 70. The line scan current signal is synchronised to the line sync signal from the host computer. Ramp regulator 230 generates an error signal for controlling the amplitude of the line scan current signal and therefore the width of picture displayed on CRT 10. The picture width can be adjusted by adjusting a reference input value R. Feedback circuit 220 provides a feedback signal F derived from the amplitude of the line scan current signal to ramp regulator 230. Error signal E is determined by ramp regulator 230 as a function of the difference between reference value R and feedback signal F. Ramp generator 210, ramp regulator 230, and feedback circuit 220 therefore constitute a negative feedback control loop that operates to maintain the width of the picture displayed on the CRT constant despite changes in the horizontal scan frequency.

Figure 3:
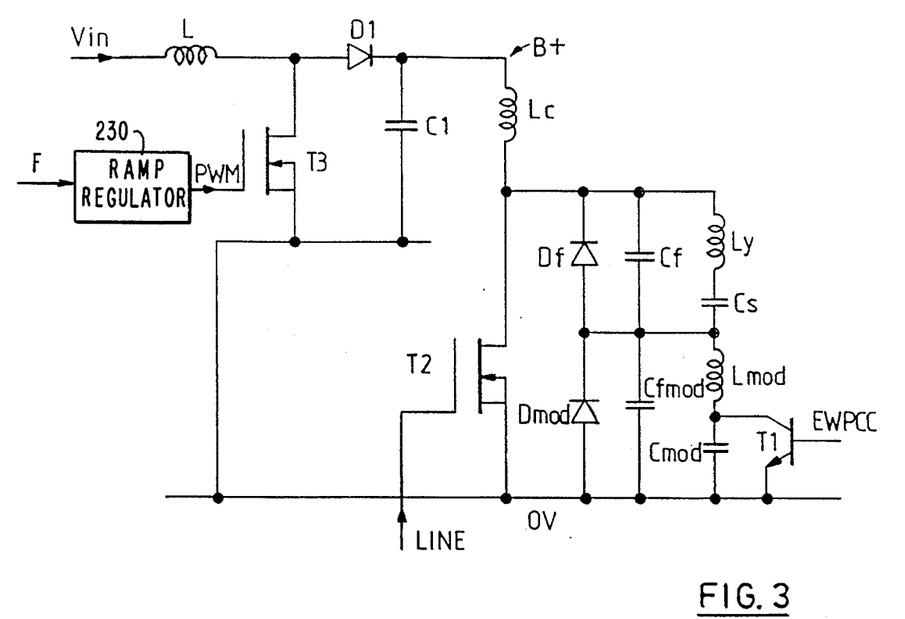
FIG. 3 is a circuit diagram of a ramp generator for the line scan circuit.

Referring now to FIG. 3, in a preferred embodiment of the present invention, ramp generator 210 comprises a field effect transistor (FET) T2 having a gate connected at LINE to a line oscillator (not shown) synchronised to the input line sync signal. The drain of T2 is connected to one end of a line choke inductor Lc and the source of T2 is connected to the 0 V supply rail from the power supply. Two diodes, Df and Dmod, are connected in series across the channel of T2. A capacitor Cf is connected across Df, and another capacitor Cfmod is connected across Dmod. Line deflection coils Ly are connected in series with an S correction capacitor Cs across Df. An inductor Lmod is connected in series with a capacitor Cmod across Dmod. The collector-emitter junction of a bipolar transistor T1 is connected across Cmod. The base of T1 is a parabolic signal formed from the frame scan signal. The end of Lc remote from the drain of T2 is connected at node B+ to the cathode of a diode D1. The anode of D1 is connected to the drain of a FET T3. A capacitor C1 is connected between the cathode of D1 and 0 V. The source of T3 is connected to 0 V. The drain of T3 is also connected, via and inductor L1 to a high voltage power supply rail Vin. The gate of T3 is connected to a Pulse Width Modulated (PWM) square wave output from ramp regulator 230. A preferred example of ramp regulator 230 will be described later with reference to FIG. 6.

In operation, T2, Lc, Df, and Cf collectively form a flyback circuit for generating a ramp current signal in deflection coils Ly. The operation of flyback circuits is well known in the art of electronic circuit design and therefore will not be discussed in detail herein. Briefly, as T2 is alternately turned on and off, electrical energy is alternately stored in Lc and Cf. The line scan current signal is produced by the energy transfer. The peak to peak amplitude of the line scan signal, and therefore the width of the picture displayed on the CRT screen is a function of the voltage across Lc, ie: the voltage at node B. Dmod, Cfmod, Lmod, Cmod, and T1 collectively form a diode modulator for modulating the line scan signal with an east west pincushion distortion correction (EWPCC) signal to reduce east-west pin-cushion distortion of the raster. The EWPCC signal is in the form of a parabola derived from the frame scan ramp signal.

The voltage at node B+ is controlled by a boost circuit formed by T3, C1, D1 and L1. The pulse width of the PWM signal at the base of T3, together with the voltage Vin, determine the voltage at B. The voltage at B can therefore be varied by varying the pulse width of the PWM signal at the base of T3 to vary the amplitude of the line scan signal, and therefore the picture width, at a particular line sync frequency or, more importantly, to maintain the picture width constant despite changes in line sync frequency over a broad frequency range.

Figure 4:
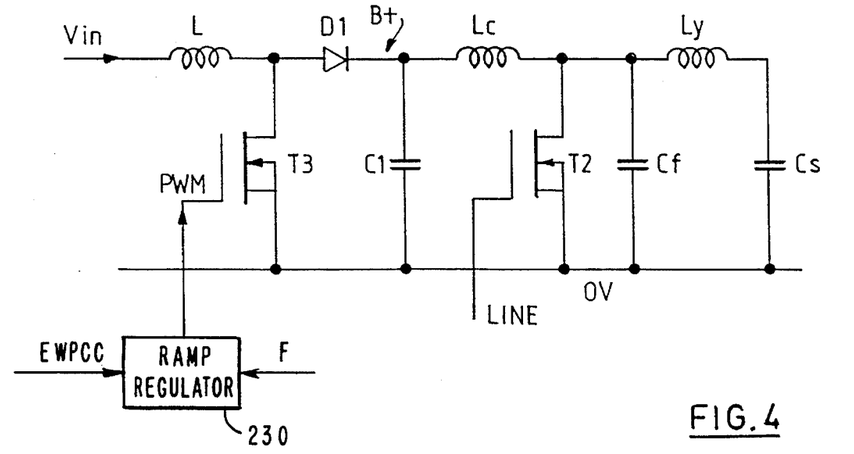
FIG. 4 is a circuit diagram of another ramp generator for the line scan circuit.

By varying the voltage at node B as a function of the EWPCC signal, the ramp generator of the present invention can be simplified because Lmod, Cmod, T1, Dmod, and Cfmod are no longer required and can therefore be removed. For example, referring now to FIG. 4, in a preferred modification of the ramp generator shown in FIG. 3, both picture width regulation and East-West pin-cushion correction are provided by varying the voltage at node B. Specifically, ramp regulator 230 modulates the PWM signal at the gate of T1 as a function of the parabolic EWPCC signal. This permits simplification of the ramp generator of FIG. 3 as Cmod, T1, Dmod and Cfmod are no longer required. Df can be made integral to T2.

Figure 5:
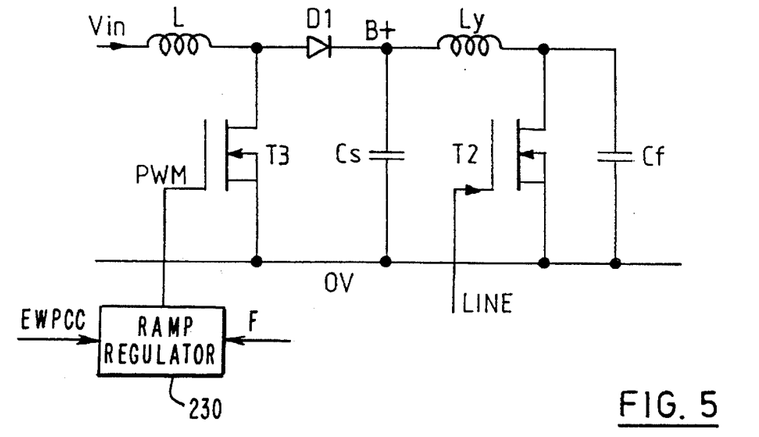
FIG. 5 is a circuit diagram of yet another ramp generator for the line scan circuit.

In operation, choke Lc isolates the voltage at node B from high voltage flyback pulses (typically 1.2 kV peak) on the drain of T2. However, the voltage across Cs is substantially the same as that at node B. Thus, line choke Lc can be replaced by deflection coils Ly. Capacitor C1 of the boost circuit can additionally act as the S correction capacitor, leading to a further simplification of the ramp generator. For example, referring to FIG. 5, in a modification of the ramp generator shown in FIG. 4, deflection coils Ly are connected between node B and the drain of T2 and S correction capacitor Cs is connected between node B and 0 V.

As hereinbefore described with reference to FIG. 2, ramp regulator regulates picture width as a function of a feedback signal F from the output of ramp generator 210. Feedback signal F is determined by the peak current in the deflection coils 80 and thus provides a measure of the width of each raster line scanned. Referring back to FIG. 3, when T3 turns on, current begins to flow in inductor L and a magnetic field is thus established. However, no current flows in the flyback circuit as a result of this current. In conventional arrangements, feedback signal F alone is returned from ramp generator 210 to determine the on time of T3. However, feedback signal F is derived from the line scan signal during the previous cycle. In other words, feedback signal F corresponds to the previous line scan period. T3 is turned off and the collapsing field around inductor L causes current to flow via D1 into the flyback circuit. The cycle then repeats. Thus feedback signal F always lags by one line period. Thus in conventional arrangements, regulator 230 may take two or more line periods to recover from a step input. Error signal E will thus exist for at least one line period. Thus, in conventional arrangements, because of the poor transient response of ramp regulator 230, if the reference input R changes, or the line frequency changes, or at worst case both change simultaneously, the recovery time may be sufficiently long to damage the ramp generator 210.

Figure 6:
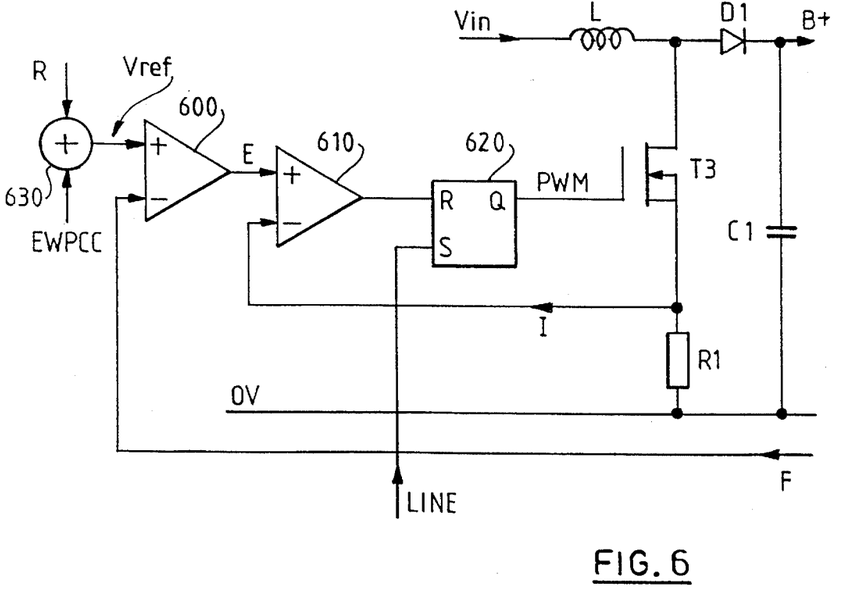
FIG. 6 is a circuit diagram of a ramp regulator for the line scan circuit.

The above problem is solved in a preferred embodiment of the present invention by providing ramp regulator 230 in the form shown in FIG. 6.

Referring now to FIG. 6, in a preferred embodiment of the present invention, ramp regulator 230 comprises a Set-Reset (SR) latch 620. The output Q of SR latch 620 is coupled to the gate of T3. A resistor R1 is connected between the source of T3 and 0 V. The Set input S of SR latch 620 is connected to the line drive signal LINE. The Reset input of SR latch 620 is connected to the output of a comparator 610. The negative input of comparator 610 is connected via feedback loop I to the source of the T3, and the positive input of comparator 610 is connected to the output of a difference amplifier 600. The positive input to amplifier 600 is connected to a reference voltage level Vref. A summing junction 630 determines Vref as the sum of reference input R and East-West pincushion distortion signal EWPCC. The negative input of the comparator is connected via the feedback loop F (see FIG. 2) to the output of the ramp generator 210 (drain of T2 in FIGS. 3, 4, and 5).

In operation, at initial turn on, output Q of SR latch 620 is low. Therefore, T3 is turned off. As input S of latch 620 goes high on the rising edge of line drive signal LINE, output Q goes high. Therefore, T3 turns on. The current through L and the channel of T3 therefore increases linearly. Thus, the voltage across R1, and hence the voltage at the negative input of comparator 610, increases linearly. When the voltage on the negative input of comparator 610 reaches the voltage on the positive input of comparator 610, the output of comparator 610 goes high. Therefore, the Reset input of latch 620 goes high. The output of latch 620 thus goes low and T3 turns off. When T3 turns off, the voltage across R1 goes back to 0 V. The voltage on the positive input of comparator 610 is determined by amplifier 600 as a function of the difference between the reference voltage level on the positive input of comparator 600 and the feedback signal F on the negative input of comparator 600, by partially replacing the feedback signal F from ramp regulator 210 with current feedback I.

Returning again to FIG. 2, the width regulation in the line scan circuit is dependent on feedback circuit 220 returning a thermally stable feedback signal F that faithfully represents the peak current in the deflection coils 70 from one raster line to the next.

Figure 7:
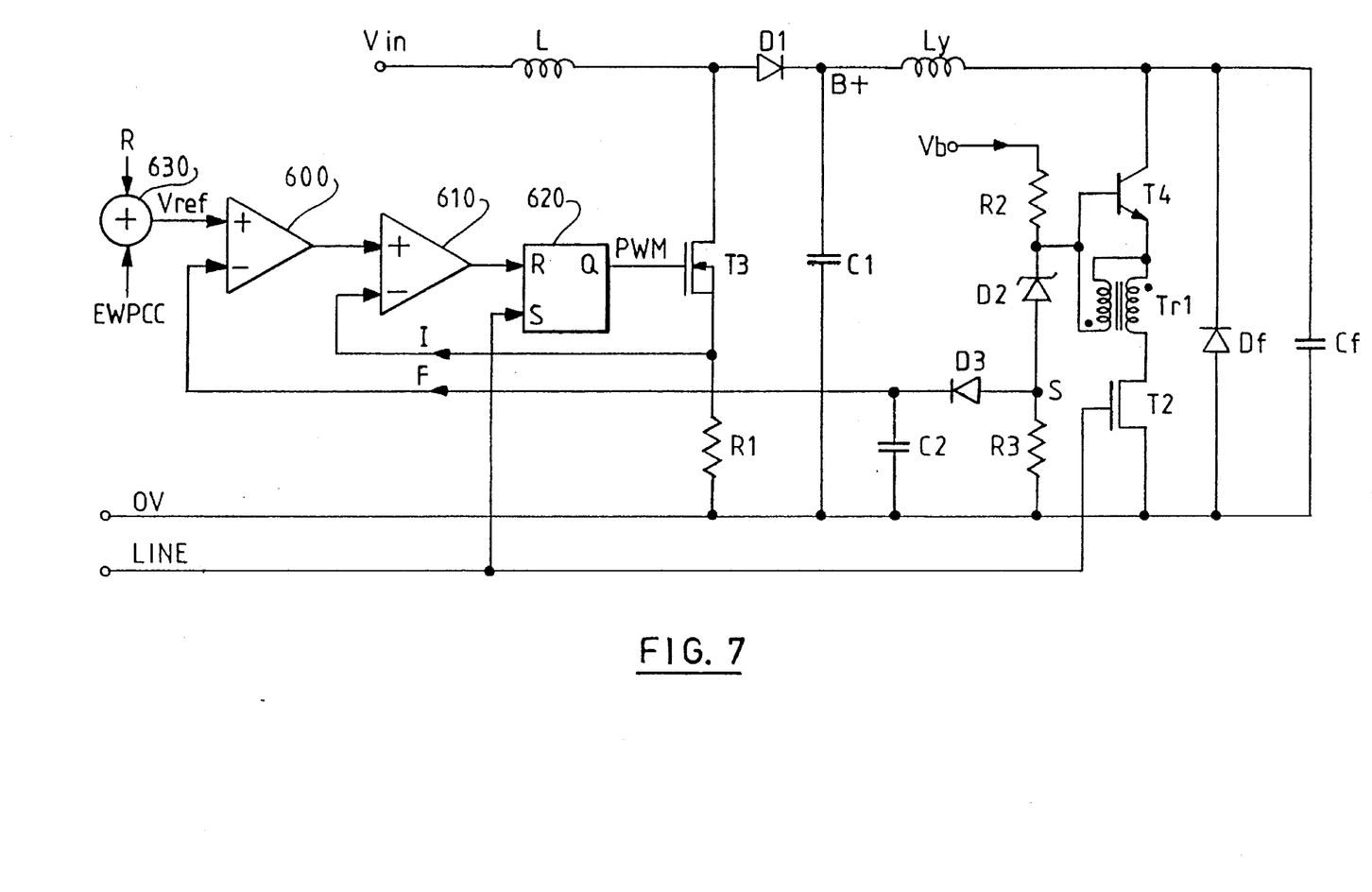
FIG. 7 is a circuit diagram of a line scan circuit.

Referring now to FIG. 7, a line scan circuit of the present invention comprises a bipolar transistor T4 connected to switching transistor T2 in an emitter-switch configuration. The collector of T4 is connected to deflection coils Ly. The emitter of T4 is connected to the drain of T2 via the primary winding of a current transformer Tr1. The secondary winding of Tr1 is connected at one end to the emitter of T4 and at the other end to the base of T4. The base of T4 is connected to a constant voltage source Vb through a resistor R2. The cathode of a zener diod D2 is connected to the base of T4. The anode of D2 is connected to 0 V via a 1 ohm resistor R3. A peak detector formed by a diode D3 and a capacitor C2 is connected to node S at the junction between R3 and D2 anode. The cathode of D3 is connected to the negative input of amplifier 600 to complete a negative feedback loop.

In operation, T4, T2, Df and Cf form a flyback circuit as hereinbefore described. In accordance with the presnet invention, however, D2, R3, D3 and C2 in operation form feedback circuit 220.

When T2 is turned on, a current path is initially established from voltage source Vb, resistor R2, the base-emitter junction of T4, the primary winding of Tr1, and T2 to 0V. The polarities of the primary and secondary windings of Tr1 are arranged relative to each other such that the current flow through the primary winding of Tr1 when T2 turns on produces a current in the second winding of Tr1 that flows into the base of T4, thereby boosting the current flowing into the base of T4 from voltage source Vb and resistor R2. T4 starts to turn on. Therefore, current starts to flow from node B+, through Ly, T4, the primary winding in Tr1, and T2 to 0 V. The increased current flow in the primary winding of Tr1 as T4 turns on increases the current flowing from the secondary winding of Tr1 into the base of T4, thereby turning T4 on harder. Tr1 thus provides positive feedback to rapidly drive T4 hard into saturation in response to T2 turning on. It will be appreciated that Tr1 also reduces the demand placed on voltage source Vb during turn on of T2 and permits R2 to be of lower power rating.

When T2 turns off, the current path through deflection coils Ly, T4 and the primary winding of Tr1 is near-instantaneously broken. The base current to T4 from the secondary winding of Tr1 thus falls rapidly to zero. The current at the collector of T4 is however highly inductive by virtue of Ly and continues to flow out of T4 but through the base of T4 in the reverse direction. D2 prevents the voltage on the base of T4 rising significantly as a function of the collector current flow as T4 turns off by clamping the base of T4 to a few volts above 0 V. The collector current flowing through the base in the reverse direction flows through D2 and R3 to ground. The current continues to flow until the charge stored in a parasitic capacitance of base-collector junction of T4 falls to zero. The time taken for the parasitic capacitance to be cleared of charge is known as the storage time of T4. The voltage dropped across R3 is directly proportional to the zener current of D2. The zener current of D2 is directly proportional to the collector current of T4 during the storage time. The collector current of T4 during the storage time is also the peak scan current in deflection coils Ly. The voltage dropped across R3 is therefore directly proportional to the peak scan current in deflection coils Ly. In practice, the voltage signal across R3 has a trapezoidal waveform at the line scan frequency. The trailing peak of the waveform is proportional to the peak current in deflection coils Ly. D3 and C2 peak detect the trailing peak of the waveform to produce a feedback signal F in the form of a DC voltage level at the negative input of amplifier 600 which is proportional to the peak current in deflection coils Ly. The present invention thus permits the feedback signal F to be generated as a function of the peak current in the deflection coils Ly without introducing significant energy losses into the current path through the deflection coils Ly and thus without adversely affecting the linearity of the line scan signal. Furthermore, the feedback signal F is produced, in accordance with the present invention, by relatively simple and cheap components.

Examples of deflection apparatus of the present invention have now been described. From the following, it will be appreciated that the present invention is equally applicable to EHT generator 30. It will also be appreciated from the following the present invention is particularly advantageous where the EHT generator 30 comprises a regulator to compensate the generated EHT for changes in line scan frequency. Conventional EHT regulators have the same problem of recovery time occurring in the conventional ramp regulators hereinbefore mentioned. In accordance with the present invention, the problem of recovery time associated with conventional EHT regulators is solved by partially replacing voltage feedback from the ramp generator with current feedback.

Figure 8:
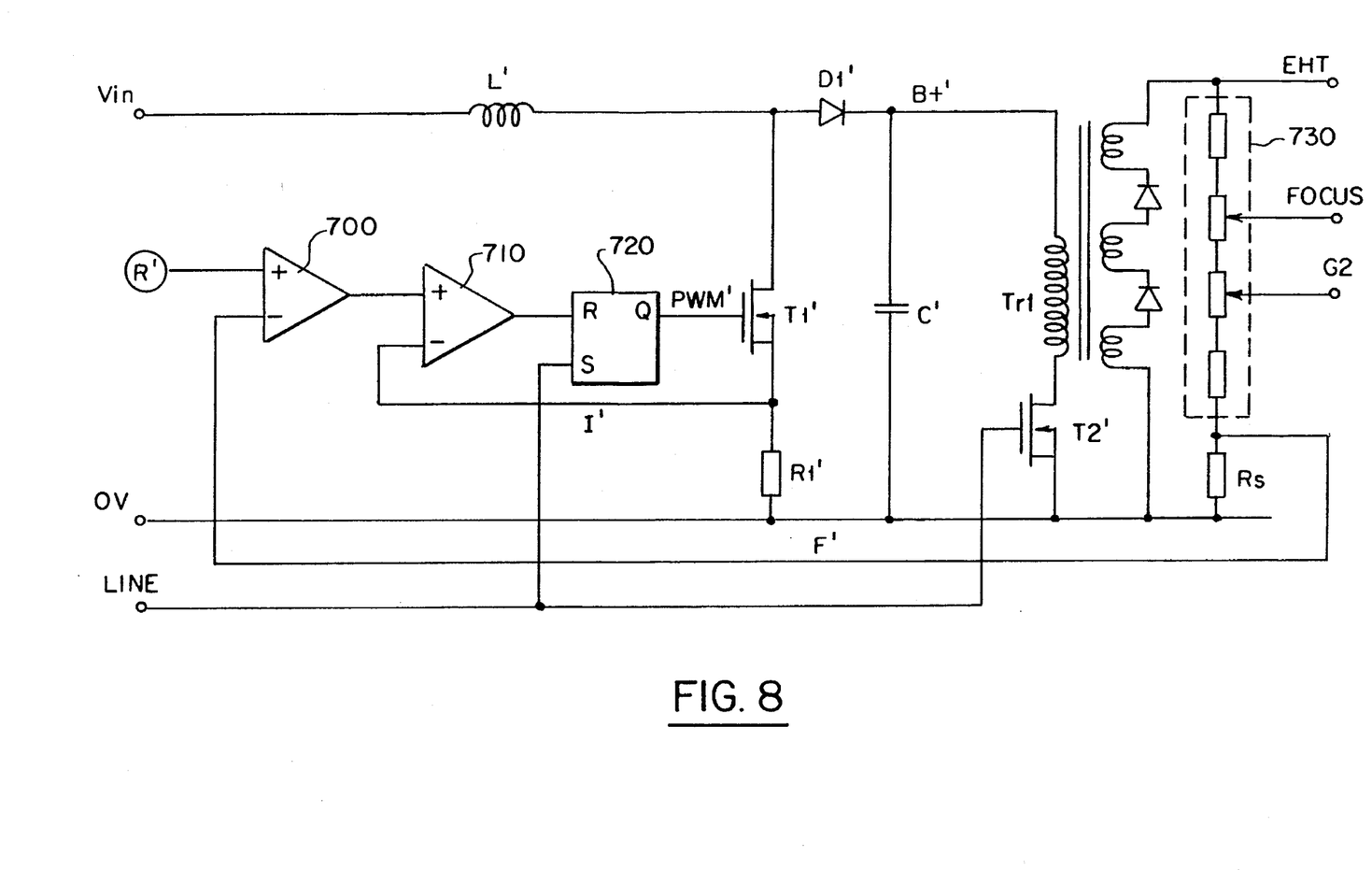
FIG. 8 is a circuit diagram of an EHT generator.

Referring now to FIG. 8, an example of an EHT generator 30 of the present invention comprises a field effect transistor (FET) T2' having a gate connected at LINE to the line oscillator (not shown) synchronised to the input line sync signal. The drain of T2' is connected to one end of the primary winding of a step up transformer Tr1 and the source of T2' is connected to the 0 V supply rail. The end of Tr1 remote from the drain of T2' is connected at node B+' to the cathode of a diode D1'. The anode of D1' is connected to the drain of a FET T1'. A capacitor C' is connected between the cathode of D1' and 0 V through a resistor R1'. The source of T1' is connected to 0 V. The drain of T1' is also connected, via an inductor L1' to the high voltage power supply rail Vin. The gate of T1' is connected to the output Q of an SR latch 720. In operation, SR latch 720 generates a PWM signal for switching T1' as will be described shortly.

In operation, T2', and Tr1, primary winding, collectively form a flyback circuit for generating a peak voltage signal across the primary winding of Tr1. The secondary winding of Tr1 steps up the peak voltage signal to produce the EHT voltage applied to the final anode of CRT 10. A potential divider 730 is connected across the secondary winding of Tr1 to produce G2 and focus voltages for respectively driving accelerating and focus electrodes of CRT 10. The peak amplitude on across the primary winding of Tr1, and therefore the level of the EHT voltage is a function of the DC voltage across the primary winding of Tr1, ie.: the voltage at node B+'.

In accordance with the present invention, the voltage at node B+' is controlled by a boost circuit formed by T1', C', D1' and Tr1, primary winding. The pulse width of a PWM signal (PWM') at the base of T1', together with the voltage Vin, determine the voltage at B+'. The voltage at B+' can therefore be varied by varying the pulse width of the PWM signal at the base of T1' to vary the EHT voltage, at a particular line sync frequency or, more importantly, to maintain a constant EHT voltage despite changes in line sync frequency over a broad frequency range.

As mentioned earlier, the output Q of SR latch 720 is coupled to the gate of T1'. A resistor R1' is connected between the source of T1' and 0 V. The Set input S of SR latch 720 is connected to the line drive signal LINE. The Reset input of SR latch 720 is connected to the output of a comparator 710. The negative input of comparator 710 is connected via feedback loop I' to the source of the T1', and the positive input of comparator 710 is connected to the output of a difference amplifier 710. The positive input to amplifier 700 is connected to a reference voltage level R'. The negative input of the amplifier 700 is connected via a feedback loop F' to a sense voltage measured across a sense resistor Rs connected in series with potential divider 730. The sense voltage is proportional to the EHT voltage.

In operation, SR latch 720, comparator 710, amplifier 700, and feedback loops I' and F' collectively form an EHT regulator for regulating the EHT voltage. At initial turn on, output Q of SR latch 720 is low. Therefore, T1' is turned off. As input S of latch 720 goes high on the rising edge of line drive signal LINE, output Q goes high. Therefore, T1' turns on. The current through L' and the channel of T1' therefore increases linearly. Thus, the voltage across R1', and hence the voltage at the negative input of comparator 710, increases linearly. When the voltage on the negative input of comparator 710 reaches the voltage on the positive input of comparator 710, the output of comparator 710 goes high. Therefore, the Reset input of latch 720 goes high. The output of latch 720 thus goes low and T1' turns off. When T1' turns off, the voltage across R1' drops back to 0 V. The voltage on the positive input of comparator 710 is determined by amplifier 700 as a function of the difference between the reference voltage level R' on the positive input of amplifier 700 and the feedback signal on the negative input of amplifier 700.

Figure 9:
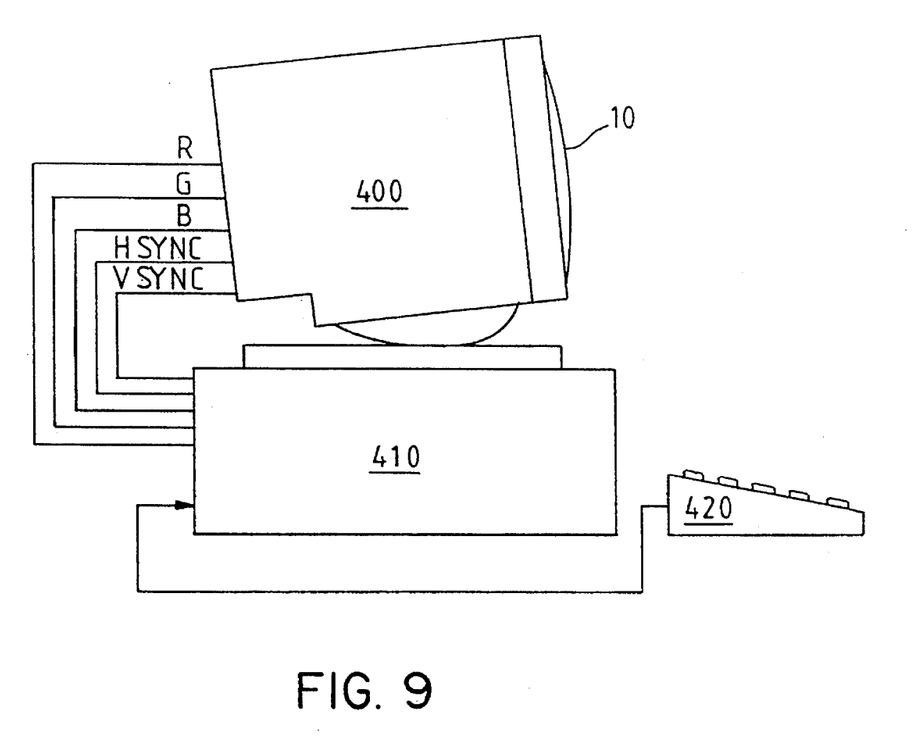
FIG. 9 is a side view of a computer system comprising a CRT display of the present invention.

FIG. 9 shows a computer system including a CRT display 400 comprising a line scan circuit of the present invention. The computer system comprises a processor 410 connected to the CRT display 400 and to an input device 420 such as keyboard 420. The processor may be in the form of a microcomputer such as an IBM Personal System/2 Model 70 microcomputer (Personal System/2 is a trademark of International Business Machines Corporation) or a mainframe computer. In operation, the CRT display generates a picture in response to Red, Green and Blue, R, G and B, video signals and line and frame, H and V, sync signals generated by the processor. The processor configures the CRT display to operate in different display modes by varying the frequency of one or more of the sync signals. However, in accordance with the present invention, the size of the picture displayed by the CRT display is maintained substantially constant and thermally stable between the different display modes.

In summary, the present invention, in one aspect, provides deflection apparatus for a raster scanned cathode ray tube display. The apparatus comprises a ramp generator having a flyback circuit T2,Lc,Cf;T2,Ly,Cf including a first inductor Lc;Ly connected in series with a first transistor switch T2. The first transistor switch T2 is responsive to a line drive signal LINE to alternately open and close a current path through the first inductor Lc;Ly between a first voltage level B+ and a second voltage level 0 V lower than the first voltage level B+ to generate a raster scan current signal in a deflection coil Ly of the display. The amplitude of the raster scan current signal is determined as a function of the first voltage level B+ and the frequency of the line drive switching signal LINE. A boost circuit T3,L,D1,C1;T3,L, D1,Cs is connected to the flyback circuit T2,Lc,Cf;T2,Ly,Cf. The boost circuit T3,L,D1,C1;T3,L,D1,Cs comprises a second inductor L connected in series with a second transistor switch T3. The second transistor switch T3 is responsive to a pulse signal PWM synchronised to the line drive signal LINE to alternately open and close a current path through the second inductor L between the second voltage level 0 V and a third voltage level higher than the second voltage level Vin to generate the first voltage level B+. The first voltage level B+ is determined as a function of the third voltage level Vin and the width of the pulses of the pulse signal PWM. A regulator is connected 230 to the flyback circuit T2,Lc, Cf;T2,Ly,Cf and the boost circuit T3,L,C1;T3,L,Cs for varying the width of the pulses of the pulse signal PWM as a function of the amplitude of the line scan signal. In another aspect, the present provides deflection apparatus for a raster scanned cathode ray tube display comprises a flyback circuit T2,T4,Ly,Df,Cf including a switch T2,T4 connected in series with an inductor Ly. The switch T4 is responsive to a line drive signal LINE to alternately open and close a current path through the inductor Ly between a first voltage level B+ and a second voltage level 0 V lower than the first voltage level B+ to generate a raster scan current signal in a deflection coil of the display. The amplitude of the raster scan signal is determined as a function of the first voltage level (B+) and the frequency of the line drive signal LINE. A feedback circuit D2,R3,D3,C2 connected to the switch T4 generates a feedback signal F as a function of current flowing out of the switch T4. A regulator 600-630,T3,L,D1, C1 is connected to the flyback circuit T2,T4,Ly,Df,Cf for varying the first voltage level B+ as a function of the feedback signal F to maintain a constant raster scan width despite variations in the frequency of the line drive signal LINE.

We claim:

1. Deflection apparatus for a raster scanned cathode ray tube display, the apparatus comprising:
   a flyback circuit (T2,T4,Ly,Df,Cf) including a switch (T2,T4) comprising a bipolar transistor (T4) connected in series with an inductor (Ly), the switch (T2,T4) being responsive to a line drive signal (LINE) to alternately open and close a current path through the inductor (Ly) between a first voltage level (B+) and a second voltage level (0 V) lower than the first voltage level (B+) to generate a raster scan current signal in a deflection coil of the display, the amplitude of the raster scan signal being determined as a function of the first voltage level (B+) and the frequency of the line drive signal (LINE);
   a feedback circuit (D2,R3,D3,C2) connected to the base electrode of the bipolar transistor T4 for generating a feedback signal (F) as a function of current flowing out of the transistor (T4) via the base electrode of the bipolar transistor (T4); and
   a regulator (600-630,T3,L,D1,C1) connected to the flyback circuit (T2,T4,Ly,Df,Cf) for varying the first voltage level (B+) as a function of the feedback signal (F) to maintain a constant raster scan width despite variations in the frequency of the line drive signal (LINE).

2. Apparatus as claimed in claim 1, wherein the feedback circuit (D2,R3,D3,C2) comprises a sense resistor (R3) in a current path between the base electrode of the bipolar transistor (T4) and the second voltage level (0 V), the feedback signal (F) being determined by a voltage signal produced across the sense resistor (R3) as a function of current flowing from the base electrode of the transistor (T4) and through the sense resistor (R3) towards the second voltage level.

3. Apparatus as claimed in claim 2, wherein the feedback circuit (D2,R3,D3,C2) comprises a peak detector (D3,C2) connected to the sense resistor (R3), the feedback signal (F) being determined by a voltage level generated by the peak detector (D3,C2) in response to the voltage signal produced across the sense resistor (R3).

4. Apparatus as claimed in claim 1, wherein the switch (T2,T4) comprises a field effect transistor (T2) connected in series with the bipolar transistor (T4) in an emitter switching configuration, the gate electrode of the field effect transistor (T2) being connected to receive the line drive signal (LINE) to alternately open and close the current path through the inductor (Ly) between the first voltage level (B+) and the second voltage level (0 V).

5. Apparatus as claimed in claim 4, wherein the bipolar transistor (T4) is an NPN transistor, the collector electrode of the bipolar transistor (T4) being connected to the inductor (Ly), the emitter electrode of the bipolar transistor (T4) being connected to the field effect transistor (T2), current flowing from the inductor (Ly) into the collector electrode of the bipolar transistor (T4) and out of the base electrode of the bipolar transistor (T4) in response to the field effect transistor (T2) turning off.

6. Apparatus as claimed in claim 1, wherein the regulator (600-630,T3,L,D1,C1) comprises a boost circuit (T3,L,D1, C1) connected to the flyback circuit (T2,T4,Ly,Df,Cf) the boost circuit (T3,L,D1,C1) comprising a second inductor (L) connected in series with a second switch (T3), the second switch (T3) being responsive to a pulse signal (PWM) synchronised to the line drive signal (LINE) to alternately open and close a current path through the second inductor (L) between the second voltage level (0 V) and a third voltage level higher than the second voltage level (Vin) to generate the first voltage level (B+), the first voltage level (B+) being determined as a function of the third voltage level (Vin) and the width of the pulses of the pulse signal (PWM), the regulator (600-630,T3,L,D1,C1) being connected to the boost circuit (T3,L,D1,C1) for varying the width of the pulses of the pulse signal (PWM) as a function of the amplitude of the line scan signal.

7. Apparatus as claimed in claim 1, wherein the inductor (Ly) includes the raster deflection coil.

8. Apparatus as claimed in claim 1, wherein the regulator (600-630,T3,L,D1,C1) comprises an error amplifier (600) connected to the feedback circuit (D2,R3,D3,C2) for generating an error signal as a function of the difference between the feedback signal (F) and a reference level, and a pulse width modulator (R1,610,620) connected to the error amplifier (600) and the boost circuit (T3,L,D1,C1) for modulating the width of the pulse signal (PWM) as a function of the error signal.

9. Apparatus as claim 8, wherein the pulse width modulator (R1,610,620) comprises: a current sensor (R1) connected to the boost circuit (T3,L,D1,C1) for generating a ramp signal as a function of current flowing in the second current path; a comparator (610) connected to the error amplifier (600) for generating an output signal when the ramp signal exceeds the error signal; and a latch (620) connected to the boost circuit (T3,L,D1,C1) and the comparator (610) for generating the pulse signal (PWM) at the control electrode of the second transistor switch (T2), the latch being set in response to the rising edge of the line drive signal, and the latch (620) being reset in response to the output signal from the comparator (610).

10. Apparatus as claimed in claim 1, in combination with a display having a cathode ray tube, the cathode ray tube being driven by said apparatus.

11. Deflection apparatus for a raster scanned cathode ray tube display, the apparatus comprising: a ramp generator having a flyback circuit (T2, Lc, Cf; T2, Ly, Cf) including a first inductor (Lc; Ly) connected in series with a first transistor switch (T2), the first transistor switch (T2) being responsive to a line drive signal (LINE) to alternately open and close a current path through the first inductor (Lc; Ly) between a first voltage level (B+) and a second voltage level (0 V) lower than the first voltage level (B+) to generate a raster scan current signal in a deflection coil (Ly) of the display, the amplitude of the raster scan current signal being determined as a function of the first voltage level (B+) and the frequency of the line drive switching signal (LINE), and a boost circuit (T3, L, D1, C1; T3, L, D1, Cs) connected to the flyback circuit (T2, Lc, Cf; T2, Ly, Cf), the boost circuit (T3, L, D1, C1; T3, L, D1, Cs) comprising a second inductor (L) connected in series with a second transistor switch (T3), the second transistor switch (T3) being responsive to a pulse signal (PWM) synchronized to the line drive signal (LINE) to alternately open and close a current path through the second inductor (L) between the second voltage level (0 V) and a third voltage level higher than the second voltage level (Vin) to generate the first voltage level (B+), the first voltage level (B+) being determined as a function of the third voltage level (Vin) and the width of the pulses of the pulse signal (PWM); and     a regulator connected (230) to the flyback circuit (T2, Lc, Cf; T2, Ly, Cf) and the boost circuit (T3, L, C1; T3, L, Cs) for varying the width of the pulses of the pulse signal (PWM) as a function of the amplitude of the line scan signal to maintain a constant raster line width as the frequency of the line drive signal is varied;

wherein the regulator comprises: a feedback circuit connected to the flyback circuit for generating a feedback signal as a function of the amplitude of the voltage impulse signal; an error amplifier connected to the feedback circuit for generating an error signal as a function of the difference between the feedback signal and a reference level, and a pulse width modulator connected to the error amplifier and the boost circuit for modulating the width of the pulse signal as a function of the error signal;

wherein the pulse width modulator (R1, 610, 620) comprises: a current sensor (R1) connected to the boost circuit (T3, L, D1, C1) for generating a ramp signal as a function of current flowing in the second current path; a comparator (610) connected to the error amplifier (600) for generating an output signal when the ramp signal exceeds the error signal; and a latch (620) connected to the boost circuit (T3, L, D1, C1) and the comparator (610) for generating the pulse signal (PWM) at the control electrode of the second transistor switch (T2), the latch being set in response to the rising edge of the line drive signal, and the latch (620) being reset in response to the output signal from the comparator (610).

12. Apparatus as claimed in claim 11, wherein the first inductor includes the raster deflection coil.

13. Apparatus as claimed in claim 11, wherein the regulator is adapted to vary the width of the pulses of the pulse signal as a function of an East-West pin cushion distortion correction signal.

14. A computer system comprising: a processor for generating raster synchronisation signals and for varying the frequency of at least one of the raster synchronisation signals to produce different display modes; and a CRT display as claimed in claim 9 connected to the processor for producing a picture on the display in response to the raster synchronisation signals and for maintaining the size of the picture substantially constant between the different display modes.

15. Apparatus as claimed in claim 11, wherein the boost circuit includes an S correction capacitor.

16. Apparatus as claimed in claim 11, in combination with a display having a cathode ray tube, the cathode ray tube being driven by said apparatus.

17. Apparatus as claimed in claim 12, wherein the regulator is adapted to vary the width of the pulses of the pulse signal as a function of an East-West pin cushion distortion correction signal.

18. Apparatus for generating an anode voltage for a CRT display, the generator comprising:

a flyback circuit (T2', Tr1) including a transformer (Tr1) having a primary winding connected in series with a first transistor switch (T2'), the first transistor switch (T2') being responsive to a line drive switching signal (LINE) to alternately open and close a current path through the primary winding between a first voltage level (B+') and a second voltage level (0 V) lower than the first voltage level (B+') to generate a voltage impulse signal across the primary winding, the amplitude of the voltage impulse signal being determined as a function of the first voltage level (B+') and the frequency of the line drive switching signal (LINE), and     a boost circuit (L', T1', D1', C') connected to the flyback circuit (T2', Tr1), the boost circuit (L', T1', D1', C') comprising an inductor (L') connected in series with a second transistor switch (T1'), the second transistor switch (T1') being responsive to a pulse signal (PWM') synchronised to the line drive signal (LINE) to alternately open and close a current path through the inductor (L') between the second voltage level (0 V) and a third voltage level (Vin) higher than the second voltage level (0 V) to generate the first voltage level (B+'), the first voltage level (B+') being determined as a function of the third voltage level (Vin) and the width of the pulses of the pulse signal (PWM'); and     a regulator (700, 710, 720) connected to the flyback circuit (T2', Tr1) and the boost circuit (L', T1', D1', C') for varying the width of the pulses of the pulse signal (PWM') as a function of the amplitude of the voltage impulse signal to maintain a constant anode voltage as the frequency of the line drive signal is varied;

wherein the regulator comprises: a feedback circuit connected to the flyback circuit for generating a feedback signal as a function of the amplitude of the voltage impulse signal; an error amplifier connected to the feedback circuit for generating an error signal as a function of the difference between the feedback signal and a reference level, and a pulse width modulator connected to the error amplifier and the boost circuit for modulating the width of the pulse signal as a function of the error signal;

wherein the pulse width modulator (R1, 610, 620) comprises: a current sensor (R1) connected to the boost circuit (T3, L, D1, C1) for generating a ramp signal as a function of current flowing in the second current path; a comparator (610) connected to the error amplifier (600) for generating an output signal when the ramp signal exceeds the error signal; and a latch (620) connected to the boost circuit (T3, L, D1, C1) and the comparator (610) for generating the pulse signal (PWM) at the control electrode of the second transistor switch (T2), the latch being set in response to the rising edge of the line drive signal, and the latch (620) being reset in response to the output signal from the comparator (610).

19. Apparatus as claimed in claim 18, wherein the boost circuit includes an S correction capacitor.

20. Apparatus as claimed in claim 18, in combination with a display having a cathode ray tube, the cathode ray tube being driven by said apparatus.

\* \* \* \* \*